(12) United States Patent
Gajjewar et al.

(10) Patent No.: US 8,479,033 B2
(45) Date of Patent: Jul. 2, 2013

(54) POWER SUPPLY DETECTION CIRCUITRY AND METHOD

(75) Inventors: Hemangi Umakant Gajjewar, Sunnyvale, CA (US); Gus Yeung, Austin, TX (US)

(73) Assignee: ARM Limited, Cambridge (GB)

( * ) Notice: Subject to any disclaimer, the term of this patent is extended or adjusted under 35 U.S.C. 154(b) by 410 days.

(21) Appl. No.: 12/801,606

(22) Filed: Jun. 16, 2010

(65) Prior Publication Data

US 2011/0314317 A1 Dec. 22, 2011

(51) Int. Cl.
*G06F 1/00* (2006.01)
*H03L 7/00* (2006.01)

(52) U.S. Cl.
USPC .......................................... 713/340; 327/143

(58) Field of Classification Search
USPC ......................................................... 327/143
See application file for complete search history.

(56) References Cited

U.S. PATENT DOCUMENTS

| | | | |
|---|---|---|---|
| 2008/0272809 A1* | 11/2008 | Idgunji et al. | 327/78 |
| 2009/0302902 A1* | 12/2009 | Do | 327/143 |
| 2010/0061159 A1* | 3/2010 | Kim et al. | 365/189.07 |
| 2010/0315133 A1* | 12/2010 | Kang | 327/143 |

* cited by examiner

*Primary Examiner* — Kim Huynh
*Assistant Examiner* — Vincent Chang
(74) *Attorney, Agent, or Firm* — Nixon & Vanderhye P.C.

(57) ABSTRACT

When switching a power supply rail for a processing circuit from a first voltage level to a second voltage level, power level detection circuitry detects when the supply voltage level reaches a predetermined voltage level. The power level detection circuitry comprises a first transistor and a second transistor which compete with one another such that the first transistor pulls a signal node voltage level at a signal node towards the supply voltage level while the second transistor pulls the signal node voltage level towards an external power supply voltage level. When the supply voltage level on the power supply rail reaches the predetermined voltage level, the first transistor overcomes the second transistor to trigger a ready signal indicating that the supply voltage level has reached the predetermined voltage level.

21 Claims, 7 Drawing Sheets

POWER SUPPLY DETECTION CIRCUITRY AND METHOD

This application claims priority to U.S. Provisional Application No. 61/223,118, filed Jul. 6, 2009, the entire contents of which are hereby incorporated by reference.

BACKGROUND OF THE INVENTION

1. Field of the Invention

The present invention relates to the field of data processing. More particularly, the invention relates to power supply detection circuitry for detecting when a supply voltage level has reached a predetermined voltage level.

2. Background to the Invention

In a data processing circuit, leakage current through the circuit contributes to the power consumed by the circuit, and so it may be desirable to reduce the amount of leakage current in order to reduce power consumption. One technique for reducing the leakage current is to gate the power supplied to the circuit block using power switches. The amount of leakage current is dependent on the voltage difference across the circuit. Hence, the processing circuit may be provided with a standby mode in which a given voltage difference is supplied to the circuit to enable processing operations to be performed, and a low leakage mode in which the voltage difference across the circuit is reduced to save leakage current but processing cannot be performed.

However, once the circuit has been placed in the low leakage mode, there will be a penalty in performance due to the time taken to switch the circuit back to the standby mode ready for the circuit to begin normal processing. When a power rail is switched from a low leakage supply level to an external supply level, then a ready signal may be generated when the power rails are within a specified range of the external supply rail to signal to the circuit that it can be reset and become operational. It is desirable to reduce the area overhead associated with generating the ready signal.

SUMMARY OF THE INVENTION

Viewed from one aspect, the present invention provides power supply detection circuitry, coupled to a power supply rail for a processing circuit, comprising at least one power supply detecting unit for detecting whether, when switching a supply voltage level of said power supply rail from a first voltage level to a second voltage level, said supply voltage level has reached a predetermined voltage level, said power supply detecting unit comprising:

a signal output for outputting a ready signal indicating whether said supply voltage level has reached said predetermined voltage level;

a signal node coupled to said signal output, said signal output outputting said ready signal in dependence on a signal node voltage level at said signal node;

a first transistor coupled to said power supply rail and said signal node; and a second transistor coupled to said signal node and an external voltage supply having an external voltage level; wherein:

said first transistor and said second transistor are configured, when switching said supply voltage level from said first voltage level to said second voltage level, to compete with said first transistor pulling said signal node voltage level towards said supply voltage level and said second transistor pulling said signal node voltage level towards said external voltage level, said first transistor being configured to overcome said second transistor when said supply voltage level reaches said predetermined voltage level; and said signal output is configured to output said ready signal in dependence on when said first transistor overcomes said second transistor.

When switching a supply voltage level of a power supply rail for a processing circuit from a first voltage level to a second voltage level, power supply detection circuitry detects whether the supply voltage level has reached a predetermined voltage level and outputs a ready signal indicating whether or not the predetermined voltage level has been reached. The ready signal is output in dependence on a signal node voltage level at a signal node that is coupled between a first transistor and a second transistor. The first transistor and the second transistor are in competition with one another, with the first transistor pulling the signal node voltage level towards the supply voltage level as the supply voltage level is switched between the first and second voltage levels, and the second transistor acting against the first transistor to pull the signal node voltage level towards an external voltage level of an external voltage supply. The interaction between the first and second transistors is such that the first transistor overcomes the second transistor when the supply voltage level reaches the predetermined voltage level. The ready signal is output in dependence on when the first transistor overcomes the second transistor. The ready signal can be used by the processing circuit to trigger one or more processing operations, such as initialisation or reset operations.

The circuit of the present technique has a simple design and a low area overhead since the competition between the first transistor and the second transistor is sufficient to detect when the supply voltage level reaches the predetermined voltage level, and so few other timing controls are required in the circuit.

The processing circuit may be any logic circuit, such as a processor, memory or cache, or memory controller, for example. The predetermined voltage level may be any voltage level between the first voltage level and the second voltage level, but will typically be a voltage level that is closer to the second voltage level than the first voltage level. For example, the predetermined voltage level could be 95% of the way between the first voltage level and the second voltage level, such that the ready signal is output shortly before the supply voltage level reaches the second voltage level. In this way, the ready signal can provide the processing circuit with an early warning that the supply voltage level has almost reached the second voltage level. This enables the processing circuit, for example, to start performing a reset operation before the second voltage level has actually been reached, ready for actual processing to begin when the second voltage level has been reached. This enables the latency associated with powering up the processing circuit from the low leakage mode to the standby mode to be reduced.

The first transistor may have a higher saturation current than the second transistor. Moreover, the first transistor may overcome the second transistor after the second transistor reaches saturation.

When switching the supply voltage level from the first voltage level to the second voltage level, the current passing through the first and second transistors initially increases linearly as the supply voltage level is adjusted. While the current increases linearly, the signal node voltage level does not vary significantly. However, as the first transistor has a higher saturation current than the second transistor, the second transistor will reach saturation before the first transistor and so after the second transistor has reached saturation the current passing through the first transistor will continue to increase while the current passing through the second transistor remains substantially the same. The current through the first transistor now becomes greater than the current passing through the second transistor, and so the first transistor begins to overcome the second transistor so as to pull the signal node voltage level towards the supply voltage level. The ready signal is then output in dependence upon when the first transistor overcomes the second transistor. By selecting first and second transistors with appropriate saturation currents, the first transistor may be arranged to overcome the second transistor when the supply voltage level reaches the predetermined voltage level, and thus the circuit can be configured to issue the ready signal when the predetermined voltage level is reached. This provides an efficient technique for generating the ready signal.

The ready signal may have a ready state indicating that the supply voltage level has reached the predetermined voltage level and an unready state indicating that the supply voltage level has not reached the predetermined voltage level. The signal output outputs the unready state until the first transistor overcomes the second transistor to pull the signal node voltage level towards the supply voltage level, whereupon the ready signal will be changed to the ready state.

The power supply detection circuitry may comprise logic coupled between the signal node and the signal output, said logic being configured to switch said ready signal from said unready state to said ready state when said first transistor overcomes said second transistor to pull said signal node voltage level beyond a threshold voltage level. The logic ensures that there is a definite switch point of the ready signal, when the first transistor overcomes the second transistor to pull the signal node voltage level beyond the threshold voltage level.

The logic may comprise various circuit elements, for example a buffer, but in one example embodiment the logic comprises an inverter.

A gate terminal of the second transistor may be coupled to the logic such that the second transistor is switched off when the signal node voltage level is pulled beyond the threshold voltage level by the first transistor. This is useful because switching off the second transistor once the signal node voltage level passes beyond the threshold causes the first transistor to dominate and pull the signal node voltage level to the supply voltage level. This prevents the signal node voltage level hovering around the threshold voltage level after the logic has flipped the ready signal. This means that the ready signal has a definite ready state after the predetermined voltage level has been reached, thus ensuring an appropriate response to the ready signal in any downstream circuitry.

The first transistor may be turned on in response to initiation of the switching of the supply voltage level from the first voltage level to the second voltage level. Thus, at the point at which the supply voltage level begins to switch from the first voltage level to the second voltage level, the first transistor is turned on so that the first and second transistors begin trying to pull the signal node voltage level in opposite directions. This competition between the first and second transistors provides the mechanism for detecting when the supply voltage level has reached the predetermined voltage level.

The circuitry may comprise a third transistor coupled between said external power supply and said signal node, said third transistor being turned on prior to switching said supply voltage level from said first voltage level to said second voltage level and being turned off in response to initiation of said switching of said supply voltage level from said first voltage level to said second voltage level. Thus, before the switch of the supply voltage level has begun, the third transistor pulls the signal node to the external power supply voltage level. After beginning the switch from the first voltage level to the second voltage level the third transistor is turned off to allow the second transistor to go into competition with the first transistor.

The third transistor may also control the second transistor to be on before beginning the switch from the first voltage level to the second voltage level.

While a single power supply detecting unit may be sufficient to detect when the supply voltage level on the supply rail reaches the predetermined voltage level, in one example embodiment the power supply detection circuitry comprises a plurality of said power supply detecting units. This can be useful because process variations in the manufacture of the power supply detecting units could adjust the saturation currents of the first and second transistors, resulting in the power supply detecting units triggering the ready signal at a voltage level that is slightly different to the desired predetermined voltage level. By providing a plurality of power supply detecting units, the effect of these process variations can be reduced.

In a further feature, the plurality of power supply detecting units may comprise a chain of N power supply detecting units; said first transistor of a first power supply detecting unit in said chain is turned on in response to initiation of said switching of said supply voltage level from said first voltage level to said second voltage level; said first transistor of an $i^{th}$ power supply detecting unit in said chain is turned on in response to said ready signal of an $(i-1)^{th}$ power supply detecting unit indicating that said supply voltage level has reached said predetermined voltage level, where $2 \leq i \leq N$; and said ready signal of an $N^{th}$ power supply detecting unit in said chain indicates to said processing circuit whether said supply voltage level has reached said predetermined voltage level.

By providing a chain of power supply detecting units, which are initiated in turn when the ready signal of the previous power supply detecting unit has indicated that the supply voltage level has reached the predetermined voltage level, the time of issuing the ready signal from the final power supply detecting unit in the chain will be dependent on whichever of the chained power supply detecting units is the slowest to switch the ready signal to the ready state. If, for example, process corners in the first power supply detecting unit of the chain cause the first transistor to overcome the second transistor particularly quickly, then the first unit will trigger a ready signal when the supply voltage level has not quite reached the predetermined voltage level. This will trigger the next power supply detecting unit in the chain to place its first and second transistors in competition. The first transistor of the second power supply detecting unit may take longer to overcome the second transistor and so by the time the second unit has issued its ready signal then the supply voltage level will have continued towards the predetermined voltage level, cancelling out the effect of the fast first power supply detecting unit. Any faster downstream power supply detecting units will then issue their ready signals almost instantly after being started since the supply voltage level will already be sufficient to trigger the ready signal. The net result of the chain of power supply detecting unit is that the effect of a fast unit may be cancelled out by other slower units. This is useful because issuing the ready signal too early is potentially more harmful than issuing the ready signal too late, since an early ready signal could cause processing errors if a processing circuit begins processing at a time when the voltage difference across the processing circuit is insufficient to ensure the correct operation of the circuit. The chain of power supply detecting units provides protection against such early ready signals.

The power supply rail may be a ground supply rail for the processing circuit, and the first voltage level and the external voltage level may be higher than the second voltage level. In this example, the power supply detection circuitry can be used in conjunction with a footer circuit for switching the ground supply rail from a high voltage level and a ground voltage level. The high voltage level of the ground supply rail may be used during low leakage mode to reduce the voltage difference across the processing circuit. When switching to standby mode, the ground supply rail is discharged to the ground voltage level to enable processing to begin.

Alternatively, the power supply rail may be the main supply rail for the processing circuit, and the first voltage level and the external voltage level may be lower than the second voltage level. In this example, the power supply detection circuitry may be used in conjunction with a header circuit for switching the main supply rail from a low leakage voltage level to an operational voltage level higher than the low leakage voltage level.

Viewed from another aspect, the present invention provides a processing apparatus comprising a processing circuit; a power supply rail for supplying a supply voltage level to said processing circuit; power control circuitry for switching said supply voltage level from a first voltage level to a second voltage level; and power supply detection circuitry according to the present technique.

The power supply detection circuitry may be included in a processing apparatus comprising a processing circuit, a power supply rail and the power control circuitry. Where the power supply rail is a VSS rail and the power control circuitry is a footer circuit, then the power supply detection circuitry detects, when switching the VSS rail from a high voltage level to a ground voltage level, when the VSS rail reaches a predetermined voltage level (for example, within 5% of the ground voltage level). Similarly, where the power supply rail is a VDD rail and the power control circuitry is a header circuit, then the power supply detection circuitry can be used to detect, when switching the VDD voltage level from a low voltage level to a high voltage level, whether the VDD voltage level has reached a predetermined voltage level (for example, within 5% of the high voltage level). As the power supply detection circuitry has little area overhead and a simple circuit operation, the overall circuit overhead of the apparatus can be reduced.

The processing circuit may be responsive to the ready signal indicating that the supply voltage level has reached the predetermined voltage level to trigger a data processing operation. For example, if the processing circuit is a memory, then the memory could respond to the ready signal by powering up certain memory blocks ready for use when the second voltage level has been reached.

In an embodiment, the processing apparatus may comprise a first processing circuit and a second processing circuit, said first processing circuit and said second processing circuit each having a corresponding power supply rail and power control circuit, at least said first processing circuit having a corresponding power supply detection circuitry; wherein switching of said supply voltage level for said second processing circuit from said first voltage level to said second voltage level is initiated in response to said power supply detection circuitry for said first processing circuit outputting said ready signal indicating that said supply voltage level for said first processing circuit has reached said predetermined voltage level.

When a processing apparatus is woken up from a low leakage state, an inrush current may be generated within the circuit as the voltage difference across the circuit increases. The inrush current may cause a momentary dip in the supply voltage level, which can trigger errors in the circuit. To reduce the amount of inrush current, a processing apparatus can be divided into different processing circuits which are powered up one-by-one. The power supply detection circuitry of the present technique can be used to control the consecutive powering up of different processing blocks within the apparatus since the power supply detection circuitry which detects when the supply voltage level to a first processing circuitry has reached the predetermined level can then issue a ready signal to trigger initiation of the switch of the supply voltage level for a second processing circuit from the first voltage level to the second voltage level. If there are more than two processing circuits within the apparatus then similarly each successive processing circuit can be powered up when the preceding processing circuit has issued a ready signal indicating that the predetermined voltage level has been reached. In this way, the power supply detection circuitry of the present technique can be used to control the powering up of the processing apparatus in an efficient way so as to reduce the inrush current.

Viewed from a further aspect, the present invention provides power supply detection circuitry coupled to power supply means for supplying power to a processing circuit, comprising at least one power supply detecting means for detecting whether, when switching a supply voltage level of said power supply means from a first voltage level to a second voltage level, said supply voltage level has reached a predetermined voltage level, said power supply detecting means comprising:

signal output means for outputting a ready signal indicating whether said supply voltage level has reached said predetermined voltage level;

signal node means for carrying a signal node voltage level, said signal node being coupled to said signal output means, said signal output means outputting said ready signal in dependence on a signal node voltage level at said signal node means;

first transistor means for coupling said power supply means and said signal node means; and second transistor means for coupling said signal node means and an external voltage supply means for supplying an external voltage level; wherein:

said first transistor means and said second transistor means are configured, when switching said supply voltage level from said first voltage level to said second voltage level, to compete with said first transistor means pulling said signal node voltage level towards said supply voltage level and said second transistor means pulling said signal node voltage level towards said external voltage level, said first transistor means being configured to overcome said second transistor means when said supply voltage level reaches said predetermined voltage level; and said signal output means is configured to output said ready signal in dependence on when said first transistor means overcomes said second transistor means.

Viewed from another aspect, the present invention provides a method for detecting whether, when switching a supply voltage level of a power supply rail for a processing circuit from a first voltage level to a second voltage level, said supply voltage level has reached a predetermined voltage level, said method comprising:

switching said supply voltage level from said first voltage level to said second voltage level;

configuring a first transistor, coupled between said power supply rail and a signal node having a signal node voltage level, and a second transistor, coupled between said signal node and an external voltage supply having an external voltage level, to compete with said first transistor pulling said signal node voltage level towards said supply voltage level and said second transistor pulling said signal node voltage level towards said external voltage level, said first transistor being configured to overcome said second transistor when said supply voltage level reaches said predetermined voltage level;

outputting a ready signal in dependence on said signal node voltage level and in dependence on when said first transistor overcomes said second transistor.

The above, and other objects, features and advantages of this invention will be apparent from the following detailed description of illustrative embodiments which is to be read in connection with the accompanying drawings.

DESCRIPTION OF EMBODIMENTS

Figure 1:
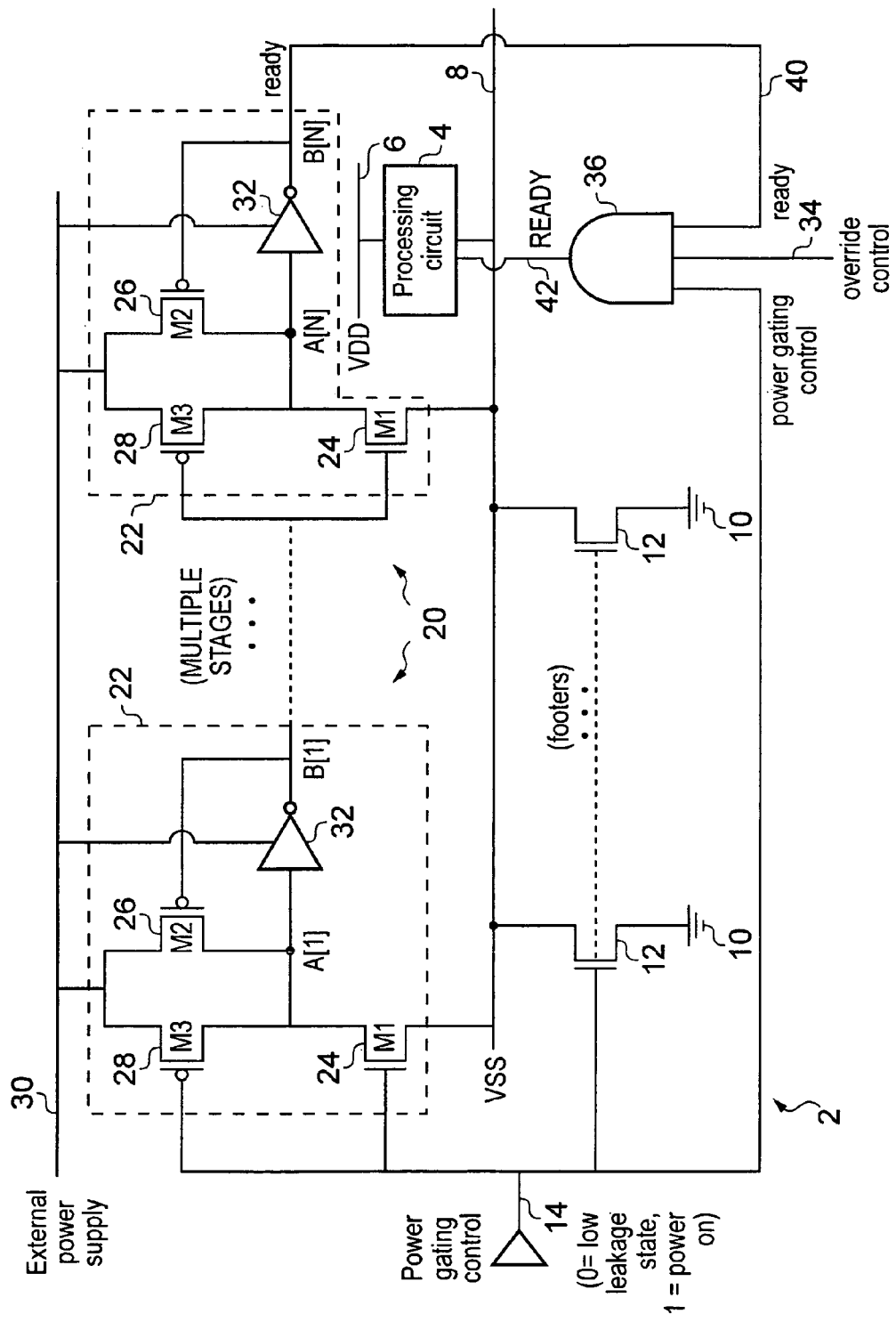
FIG. 1 schematically illustrates a processing apparatus having power supply detection circuitry for detecting when a supply voltage level on a VSS rail has reached a predetermined level.

FIG. 1 illustrates a processing apparatus 2 having a processing circuit 4 coupled between VDD rail 6 and VSS rail 8. The processing circuit 4 may be any logic circuit such as a processor or a memory, for example. The VSS rail 8 is coupled to a ground supply 10 via footer circuits 12. While FIG. 1 illustrates two footer circuits 12, there may be more footer circuits. The footer circuits 12 are turned on and off in dependence on a power gating control signal 14. When the power gating control signal 14 has a high logic state then the footer switches 12 are turned on and the VSS line 8 is discharged to ground 10, so that the processing circuit 4 is in a standby mode ready for processing. When the power gating control signal 14 has a low logic level, then the processing circuit 4 is placed in a low leakage mode by switching the footer switches 12 off so as to allow the VSS rail 8 to float to a logic level higher than the ground level. In the low leakage mode, the voltage difference between the VDD rail 6 and the VSS rail 8 is reduced in comparison to the standby mode and so the leakage current through the processing circuit 4 is lower than in the standby mode.

When switching the processing circuit 4 from the low leakage mode to the standby mode, the processing circuit 4 may begin processing operations once the supply voltage level on the VSS line 8 has reached a predetermined voltage level. A power level detection circuit (or ready signal generator) 20 is provided to detect when the supply voltage level on the VSS rail 8 has reached the predetermined voltage level. The power level detection circuit 20 comprises a number of power level detecting units 22 which are connected in a chain. While FIG. 1 shows two detecting units 22, there may instead be one detecting unit or more than two detecting units.

Each detecting unit 22 comprises a first transistor 24, a second transistor 26, a third transistor 28 and an inverter 32. The first transistor 24 has its gate coupled to the power gating control signal 14 and its source and drain coupled between the VSS rail 8 and a signal node A. The transistor 24 is an n-type transistor.

The second transistor 26 is a p-type transistor coupled between an external power supply 30 and the signal node A. The external power supply 30 has a higher voltage level than the ground supply 10. The signal at the signal node A is input to the inverter 32 whose output controls the gate of the second transistor 26. The second transistor 26 is smaller than the first transistor 24 and so has a lower saturation current than the first transistor 24.

The third transistor 28 is a p-type transistor that is coupled between the external power supply 30 and the signal node A. The third transistor 28 is switched on and off in dependence on the power gating control signal 14.

The signal output of the inverter 32 at signal node B represents a ready signal indicating whether the VSS rail 8 has reached the predetermined voltage level. When the VSS rail 8 has not yet reached the predetermined voltage level then signal node B has a low logic level indicating an unready state of the ready signal, while after the VSS rail 8 has reached the predetermined level then the inverter 32 switches the node B to a high logic level indicating a ready state of the ready signal.

For the first, and any intermediate stages within the chain of detecting units 22, the ready signal at node B is input as the power gating control signal 14 for a subsequent stage. The ready signal ripples through the chain of detecting units 22 until the final detecting unit 22 in the chain forwards the ready signal 40 to the processing circuit 4 to indicate that the processing circuit may now begin a processing operation since the VSS line 8 has reached the required voltage level. The ready signal from the final detecting unit 22 may be combined with the power gating control signal 14 and an override control signal 34 by an AND gate 36 so that the processing circuit 4 only receives a ready state of a ready signal 42 if each of the power gating control signal 14, override control signal 34 and ready signal 40 are asserted. The override control signal 34 enables the user of the apparatus to override the ready signals so that, if desired, the processing circuit 4 does not begin processing even if the ready signal 40 has been issued by the power level detection circuitry 20.

Figure 2:
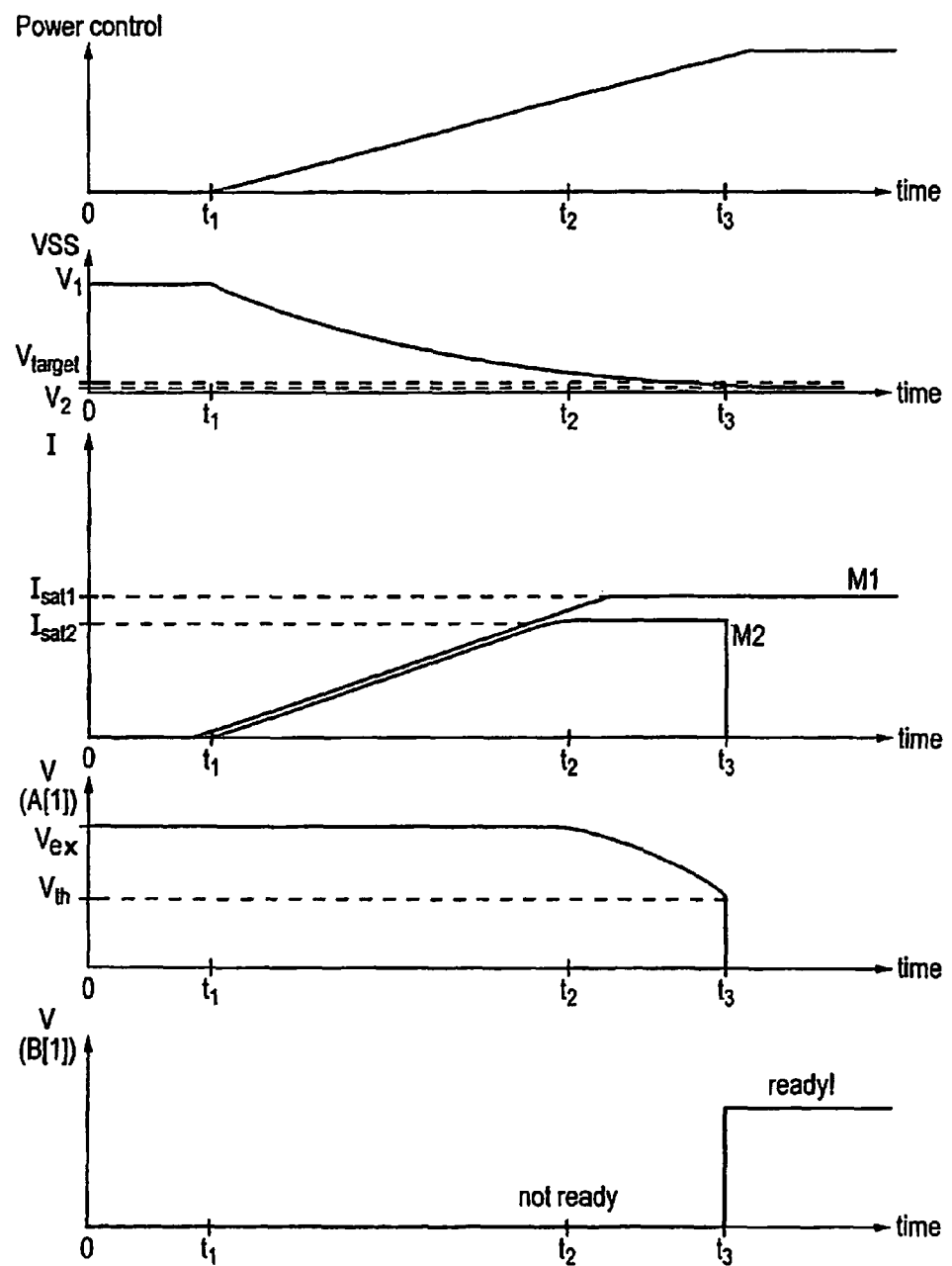
FIG. 2 illustrates an example timing diagram illustrating the operation of the circuit of FIG. 1.

FIG. 2 illustrates the operation of the processing apparatus of FIG. 1. At time 0 in FIG. 2, the power gating control signal 14 is in the low logic state indicating that the processing circuit 4 is in the low leakage mode. Hence, the footer switches 12 are off and the VSS rail 8 has drifted to a high voltage level $V_1$. First transistor 24 is off and third transistor 28 is on, so that the voltage at signal node A is at a voltage level equivalent to the difference between the external power supply voltage $V_{ex}$ and the threshold voltage of third transistor 28. Since the signal node voltage level at node A is higher than the threshold voltage $V_{th}$ of the inverter 32, the inverter 32 controls the voltage level at signal node B to be low indicating that the ready signal is in an unready state. This causes the second transistor 26 to be on so that second and third transistors 26, 28 are both acting to pull the signal node voltage level at node A towards the power supply voltage $V_{ex}$.

At time $t_1$ in FIG. 2, the power gating control signal 14 is switched towards the high logic state indicating a switch to the standby (power on) mode. This switches the footers 12 on so as to discharge the VSS rail 8 towards the ground supply voltage $V_2$. Since the processing circuit 4 includes an RC load, the power control signal and VSS rail take some time to reach their switched levels. The power control signal 14 gradually increases to a higher level while the VSS rail 8 gradually decreases towards a low level. The target voltage level $V_{target}$ (i.e. the predetermined voltage level that should trigger the ready signal) is reached at time $t_3$. In this example, the predetermined voltage level is within a few percent of the ground supply voltage $V_2$.

When the power control signal 14 is switched towards the high state at time $t_1$, the first transistor 24 is turned on and the third transistor 28 is turned off, thus bringing the first transistor 24 and the second transistor 26 into competition with one another. The first transistor 24 acts to pull the signal node voltage level at node A towards the VSS voltage level (which is gradually decreasing) while the second transistor 26 acts to pull the signal low voltage level A towards the external power supply level V. At time $t_1$, the voltage difference across the first and second transistors 24, 26 is initially small and so the current passing through these transistors is low. As the VSS voltage level drops between the times $t_1$ and $t_2$, the voltage difference across transistors 24, 26 drops and so the current through the first and second transistors 24, 26 increases linearly. As the current through transistors 24, 26 is approximately equal, neither of the transistors 24, 26 is dominant and so the voltage level at node A does not decrease significantly between times $t_1$ and $t_2$.

The second transistor 26 has a lower saturation current $I_{sat2}$ than the saturation current $I_{sat1}$ of the first transistor 24. At time $t_2$, the current through the second transistor 26 reaches the saturation current $I_{sat2}$ and so stops increasing even though the voltage difference across the second transistor 26 continues to increase as the VSS level drops. However, as the saturation current $I_{sat1}$ of the first transistor 24 is higher than the saturation current on the second transistor 26, the current through the first transistor 24 continues to increase and so now the first transistor 24 starts to pass more current than the second transistor 26. Thus, between times $t_2$ and $t_3$ the first transistor 24 starts to overcome the counteraction of the second transistor 26 and pulls the signal node voltage at signal node A towards the supply voltage level on the VSS line 8. FIG. 2 shows the signal node A voltage level decreasing between times $t_2$ and $t_3$.

At time $t_3$, the signal node A voltage level reaches the threshold voltage $V_{th}$ for switching the inverter 32. This causes a definite switch to the ready (high logic) state of the ready signal at signal node B. When the inverter 32 switches signal node B to a high logic state, the second transistor 26 is turned off. Now, there is no longer any opposition to the first transistor 24 and so the first transistor 24 pulls the signal node A voltage level down to the VSS voltage level.

By adjusting the relative sizes, and hence the saturation currents, of first and second transistors 24, 26, the circuits can be arranged so that the time $t_3$, where the ready signal switches from the unready to the ready state, coincides with the point at which the voltage level on the VSS line reaches the predetermined voltage level $V_{target}$.

The ready signal at node B is supplied to a following power level detecting stage 22 of the detection circuitry 20 to trigger the following stage to perform the same action as the preceding stage. However, in the following stage 22 the voltage level on the VSS line 8 will already have become close to the predetermined voltage level, and so the voltage difference across the first and second transistors 24, 26 will already be large enough for the first transistor 24 to be close to overcoming the second transistor 26. Hence, the following stage should not take as long to switch the ready signal to the ready state as the preceding state. Once all of the detecting stages in the detection circuitry 20 have generated a ready signal having the ready state, then the final ready signal 40 is issued to the processing circuit 4. Providing multiple detecting stages 22 helps to mitigate the effects of a fast-switching detecting stage 22, so that the final ready signal 40 is issued at a time dependent on the slowest of the multiple detecting stages 22 within the detection circuitry 20. This helps to avoid situations where the ready signal 40 is generated too early, which could cause errors when in the processing circuit 4.

Figure 3:
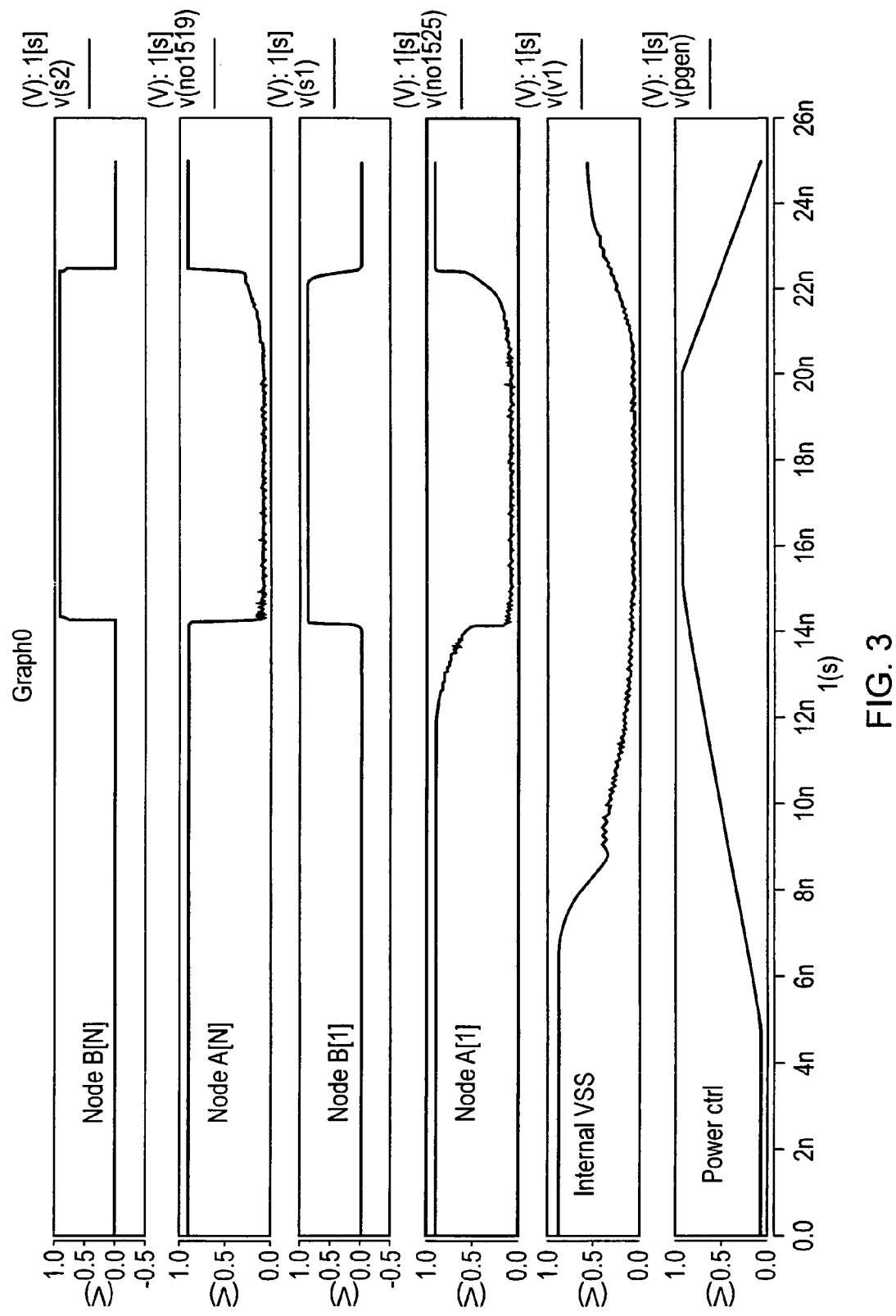
FIG. 3 illustrates the simulated operation of the circuit of FIG. 1.

FIG. 3 illustrates a timing diagram showing simulation results of the circuits shown in FIG. 1. FIG. 3 shows how nodes A and B remain relatively constant until the VSS voltage level drops close to the second voltage level. Once the VSS voltage level reaches the predetermined voltage level then nodes A and B switch to indicate that the voltage level has dropped sufficiently to allow the processing circuit 4 to perform a processing operation. Once the first stage 22 of the detection circuitry 20 has generated a ready signal then the following stage 22 is allowed to begin. The delay between the first detecting stage 22 and the $N^{th}$ detecting stage switching their respective ready signals to the ready state is too short to be visible in FIG. 3.

FIG. 3 also shows the signal transitions when switching from the standby mode to the low leakage mode (see the period between 20 ns and 26 ns in FIG. 3). When the power gating control signal 14 is switched back to the low level then the footer switches 12 are turned off so that the VSS voltage level is allowed to float upwards. This switches off the first transistor 24 and switches on the third transistor 28 which pulls the signal node A back to a high level, causing the ready signal at node B to return to the low level state indicating the unready state.

Figure 4:
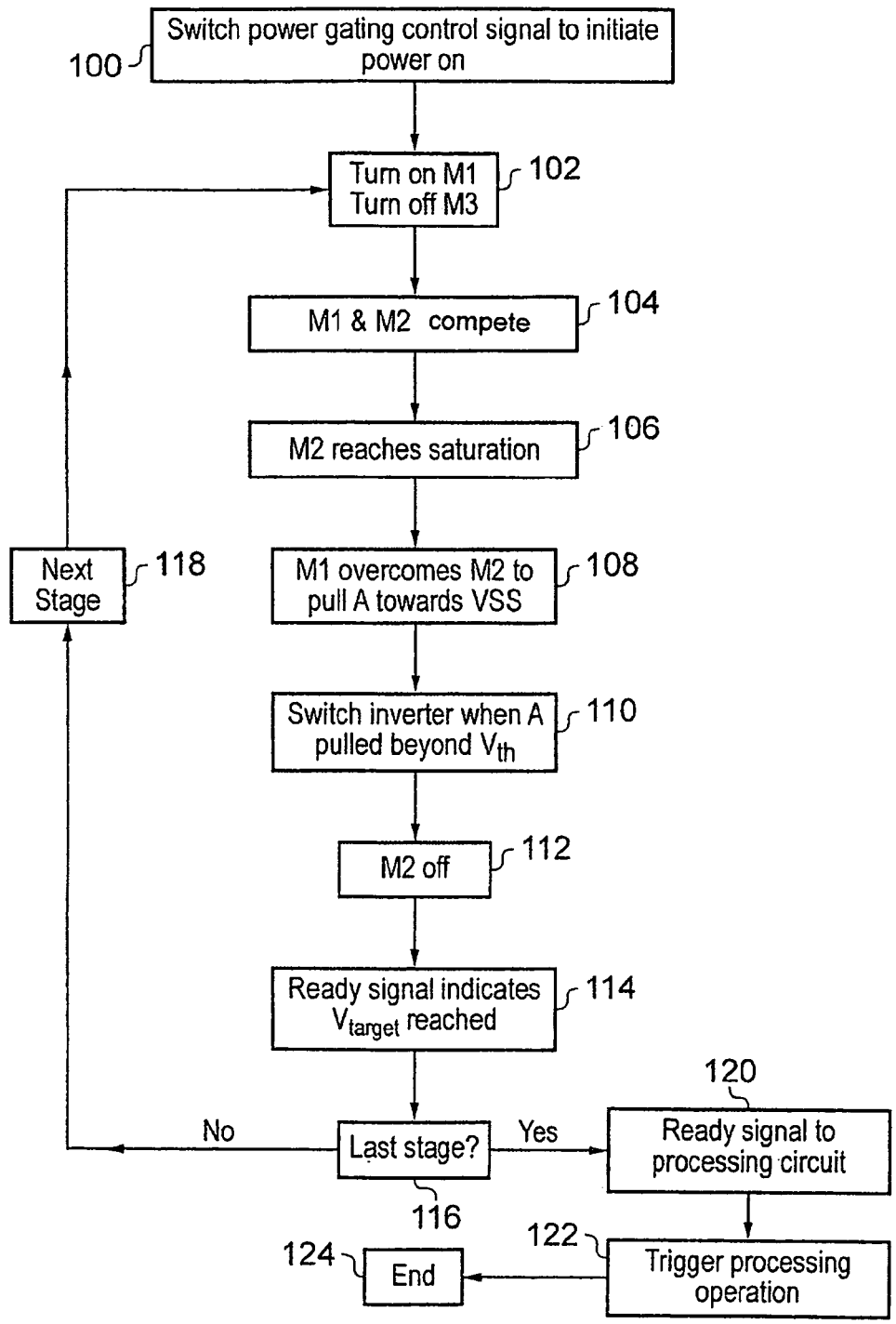
FIG. 4 illustrates a method of detecting when the supply voltage level has reached a predetermined voltage level.

FIG. 4 illustrates a method of detecting when the supply voltage level reaches the predetermined voltage level. Initially, the processing apparatus 2 is in the low leakage mode and so the VSS line 8 is in a high voltage state. Third transistor 28 is on so that signal node A is pulled towards the external power supply voltage.

At step 100, the power gating control signal is switched to initiate the power up of the apparatus. Thus, the footer switches 12 begin to pull the VSS rail 8 towards the ground supply level. At step 102, the first transistor 24 is turned on and the third transistor 28 is turned off so that the transistors 24, 26 are allowed to compete at step 104 with the first transistor 24 pulling the signal node A towards the VSS supply level and the second transistor 26 pulling the signal node A towards the external power supply level of the external power supply 30. The first and second transistor 24, 26 effectively cancel one another out until at step 106 the second transistor 26 reaches saturation.

Once the second transistor 26 has reached saturation, then the first transistor 24 begins to pass more current than the second transistor 26, since the first transistor 24 has not yet reached saturation at the point where the second transistor 26 is saturated. Thus, at step 108 the first transistor 24 overcomes the action of the second transistor 26 and pulls the voltage at the signal node A towards the VSS voltage level. At step 110, the voltage level at the signal node A is pulled beyond a threshold voltage $V_{th}$ of the inverter 32 and so the inverter 32 switches the level of the signal node B to a high state. This causes the second transistor 26 to be turned off at step 112. Thus, the first transistor 24 no longer faces any competition from the second transistor 26 and so the first transistor 24 pulls the voltage level at signal node A to the VSS voltage level.

Meanwhile, at step 114 the high voltage level at signal node B causes a ready signal output from the detecting stage 22 to indicate that the predetermined voltage level $V_{target}$ has been reached. At step 116, it is determined whether the present power level detecting stage 22 is the last stage of the apparatus 20. If the present stage is not the last stage, then at step 118 the ready signal is provided to the next stage 22 and steps 102 to 114 of FIG. 4 are repeated for the next stage. When the last stage is reached at step 116, then the generated ready signal is provided to the processing circuit at step 120 to trigger a processing operation within the processing circuit 4 at step 122. The method of FIG. 4 then ends.

Figure 5:
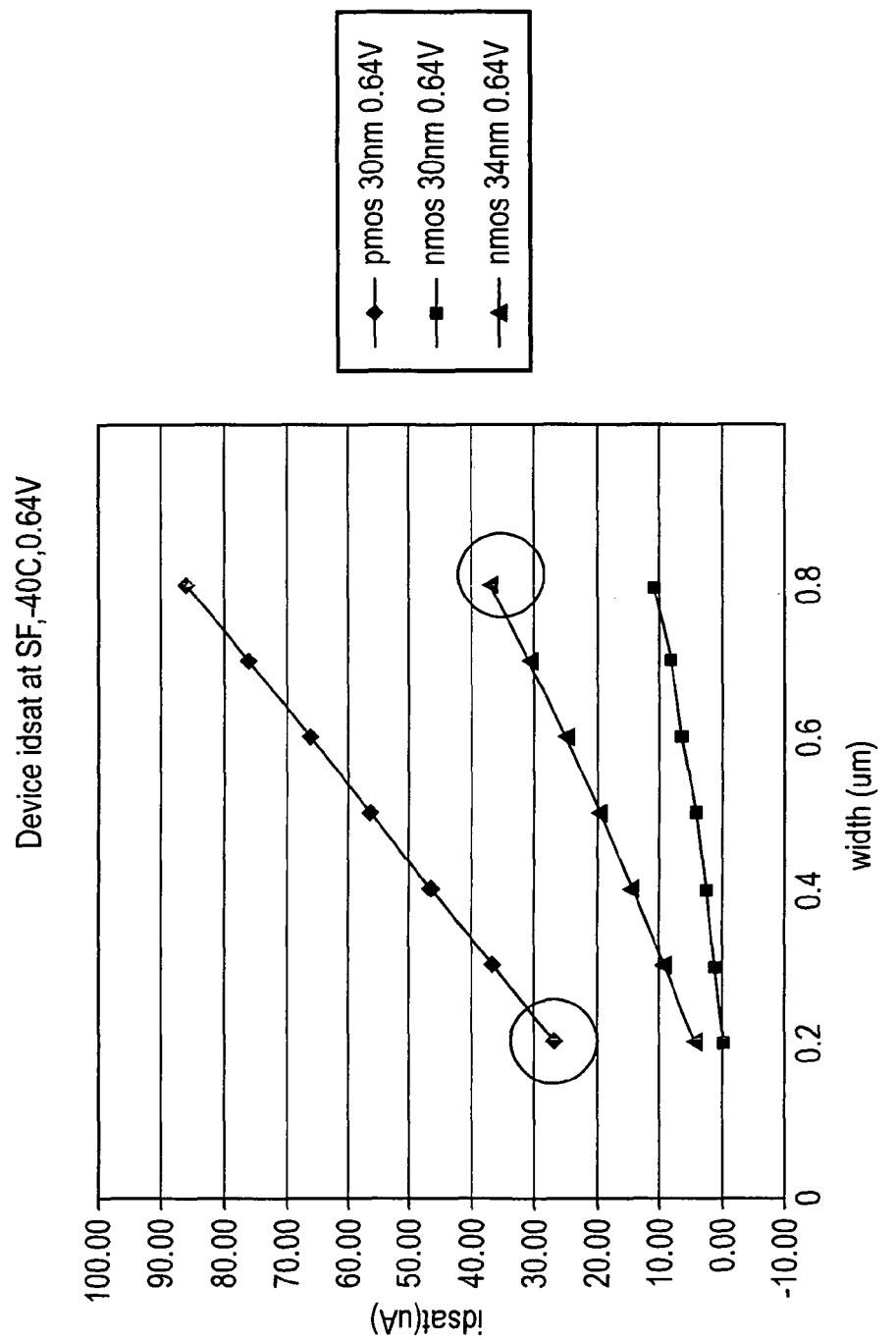
FIG. 5 illustrates the relationship between saturation current and transistor size for different types of transistor.

The timing at which the ready signal is generated depends on the saturation currents of the first and second transistors 24, 26. To enable the first transistor 24 to eventually overcome the opposition of the second transistor 26, the saturation current of the first transistor 24 should be higher than the second saturation current of the second transistor 26. FIG. 5 illustrates the variation of the saturation current with the transistor size of different types of transistors. The saturation current is proportional to the width of the transistor. The saturation current also depends on the process scale used for the transistor.

FIG. 5 shows the variation of saturation current with transistor width for 30 nm and 34 nm nmos transistors and a 30 nm pnos transistor. FIG. 5 takes into account the worst case process corners. For the 30 nm nmos transistor, the worst case saturation current is smaller than the worst case saturation current for the 30 nm pmos transistor over the entire range of transistor widths, and so the 30 nm nmos transistor will never be able to overcome the action of the 30 nm pmos transistor. In contrast, the 34 nm nmos transistor has a higher saturation current than the 30 nm pmos transistor provided that the transistors are sized appropriately. Thus, FIG. 5 shows that a 0.8 □m nmos transistor has a higher saturation current than a 0.2 □m pmos transistor and so these transistors could be used as the first and second transistors 24, 26 for the present technique. By selecting the first and second transistors 24, 26 with sizes and saturation currents at appropriate levels, the power level detection circuitry 20 can be arranged to trigger the ready signal to switch at the point where the predetermined voltage level is reached by the VSS power rail 8.

FIGS. 1 to 5 illustrate an embodiment in which the power level detection circuitry 20 detects the voltage level on an VSS power rail 8.

Figure 6:
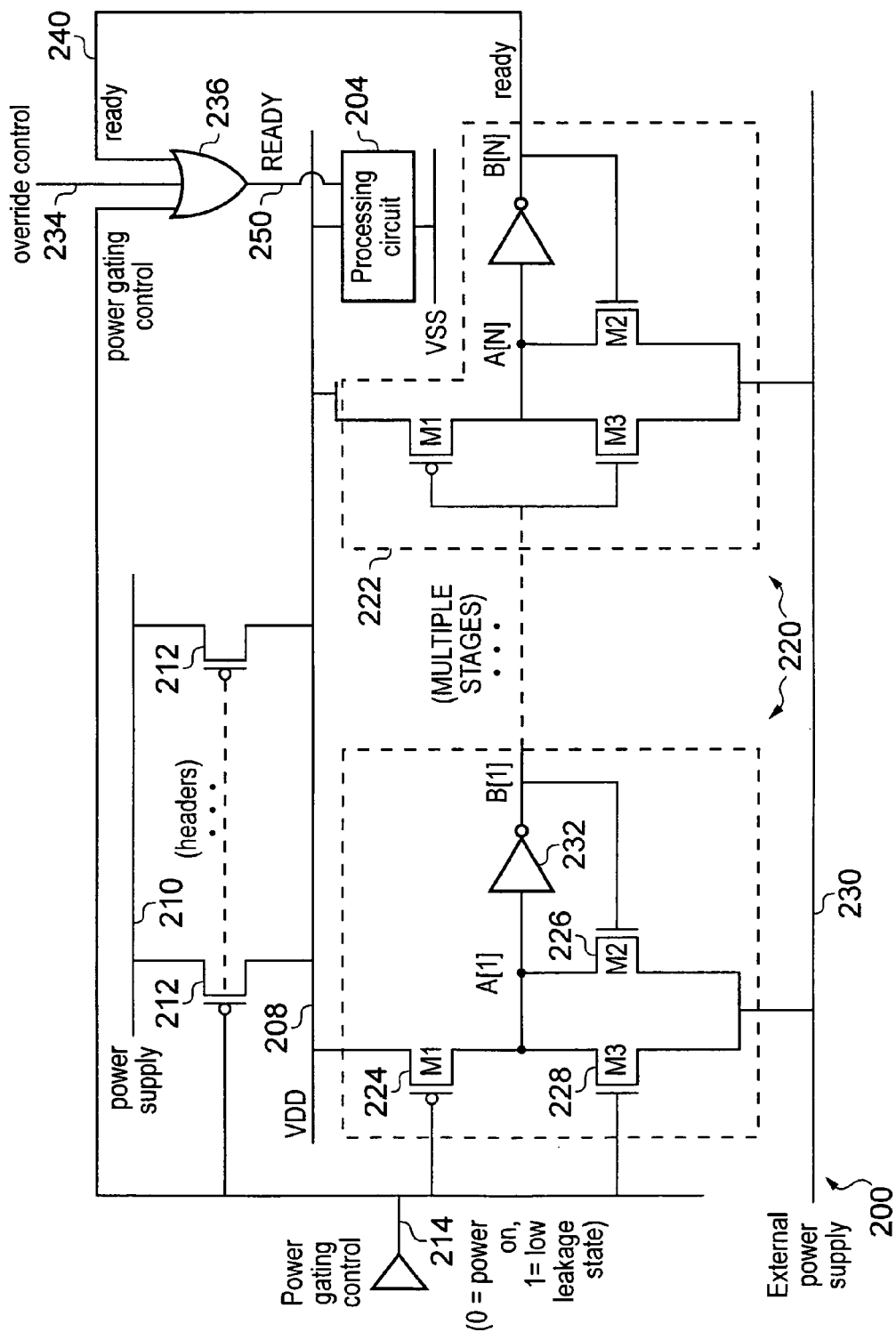
FIG. 6 illustrates a processing apparatus comprising circuitry for detecting when the supply voltage level on a VDD rail has reached a predetermined level.

FIG. 6 illustrates an alternative embodiment in which power level detection circuitry 220 is provided for detecting when the power supply on a VDD power rail 208 reaches a predetermined level. The circuit of FIG. 6 operates in a similar way to FIG. 1. In the low leakage state, the VDD rail 208 is at a low voltage level. When a power gating control signal 214 is switched to a power on state then the header switches 212 pull the VDD rail towards the voltage level of a power supply 210. At this point, transistors 224, 226 within the power level detection circuit 220 are configured to compete with one another with the first transistor 224 pulling the signal node A towards the VDD voltage level while the second transistor 226 pulls the signal node A towards an external power supply level 230 that is lower than the power supply level 210. The first transistor 224 overcomes the second transistor 226 once the second transistor 226 enters a saturation region. When the first transistor 224 has pulled the signal node A voltage level beyond a threshold level then the inverter 232 flips the signal node B to change the ready signal to a ready state. The ready signal then ripples through any remaining power level detecting units 222.

Unlike in FIG. 1, in FIG. 6 the ready state is indicated by the low logic level of the ready signal, to indicate that the VDD rail 208 has reached the target level. The high logic level of the ready signal is the unready state indicating that the target level has not yet been reached. Also, in FIG. 6 the low logic level of the power gating control signal 214 indicates the power on state and the high logic level of the power gating control signal 214 indicates the low leakage state. An OR gate 236 combines the ready signal 240 of the final power level detecting unit 222 with the power gating control signal 214 and an override control signal 234 so that only when all of these signals are logic low is the processing circuit 204 supplied with a ready signal 250 in a logic low state indicating that the voltage level on the VDD is sufficient to allow processing to begin. The processing circuit 204 is responsive to the low level of the ready signal 250 to trigger a processing operation.

Figure 7:
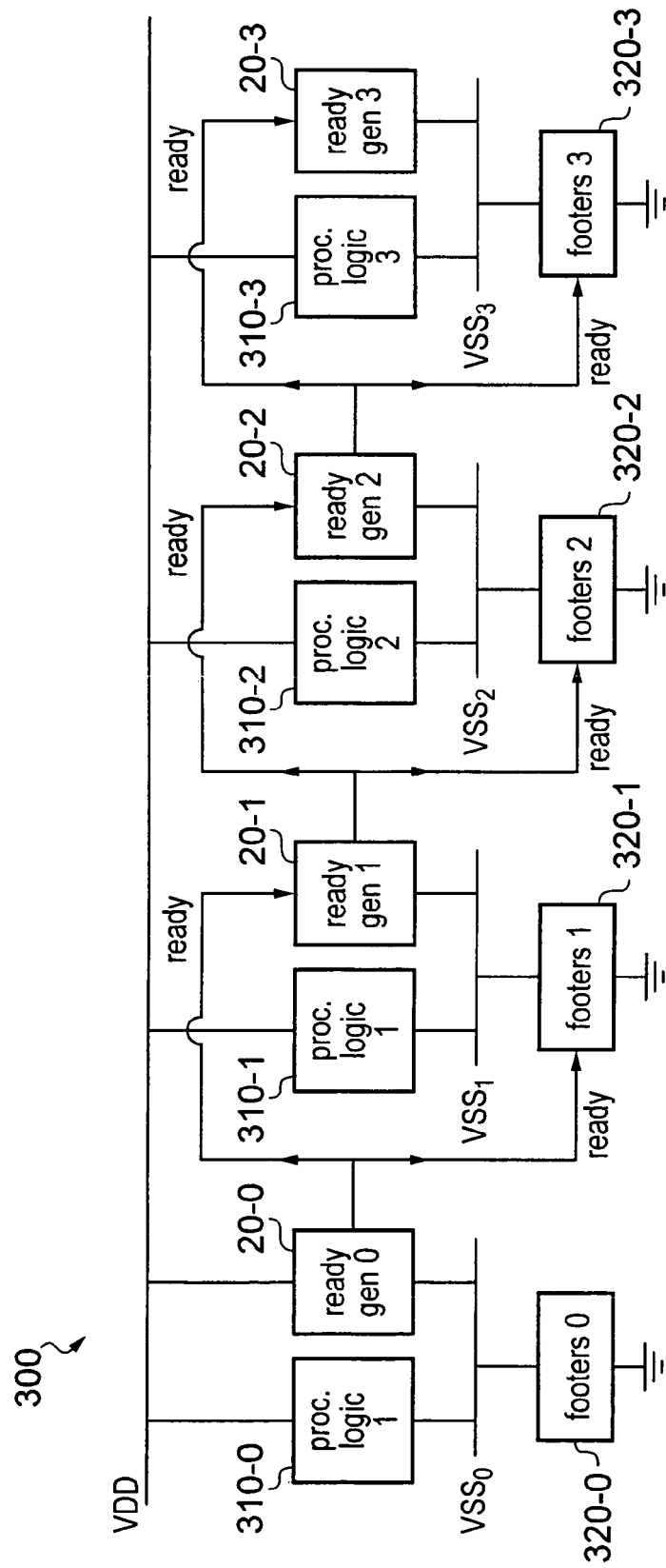
FIG. 7 illustrates the use of the power supply detection circuitry to control a sequential power up of respective processing blocks within a processing apparatus.

FIG. 7 illustrates an example of a data processing apparatus 300 in which the power level detection circuit (or ready signal generation circuit) 20 can be used to control power on of different processing blocks 310 within the apparatus 300. The apparatus 300 comprises a number of processing blocks 310. When the apparatus 300 is switched from the low leakage mode to the power on mode, the respective processing blocks 310 are successively powered up by the power control blocks 320 (in this example the power control blocks 320 are footer circuits).

A power level detection circuit 20-0 detects when the supply voltage on the VSS line $VSS_0$ for a first processing block 310-0 has reached the predetermined level and then issues a ready signal to the footer circuits 320-1 of the next processing block 310-1 to indicate that the power up of the processing block 310-1 can be initiated. The footer circuits 320-1 respond to the ready signal by starting to discharge the VSS line $VSS_1$ to ground.

Similarly, when a preceding processing block 310-$i$ has reached the predetermined voltage level then the corresponding power level detection circuit 20-$i$ issues a ready signal to trigger powering up the next processing block 310-($i$+1). In this way, the ready signal generating circuit 20 can control the separate power up of the respective processing blocks 310. This is useful because powering up different processing blocks all at the same time would generate a large inrush current which could cause processing errors in the description, whereas sequentially powering up the processing blocks 310 at different times results in a lower inrush current.

While FIG. 7 illustrates the apparatus 300 having power level detection circuits 20 for detecting when the VSS line has reached predetermined voltage level, this technique may similarly be applied to the VDD line within an apparatus so that header circuits for powering up respective processing blocks 310 are responsive to the ready signal issued by the power level detection circuit 220 for a preceding processing block 310 to begin switching the VDD line from a low level voltage to a main supply voltage.

Although illustrative embodiments of the invention have been described in detail herein with reference to the accompanying drawings, it is to be understood that the invention is not limited to those precise embodiments and that various changes and modifications may be made by one skilled in the art without departing from the scope and spirit of the invention as defined by the appended claims.

We claim:

1. Power supply detection circuitry, coupled to a power supply rail for a processing circuit, comprising at least one power supply detecting unit for detecting whether, when switching a supply voltage level of said power supply rail from a first voltage level to a second voltage level, said supply voltage level has reached a predetermined voltage level, said power supply detecting unit comprising:
   a signal output for outputting a ready signal indicating whether said supply voltage level has reached said predetermined voltage level;
   a signal node coupled to said signal output, said signal output outputting said ready signal in dependence on a signal node voltage level at said signal node;
   a first transistor coupled to said power supply rail and said signal node; and
   a second transistor coupled to said signal node and an external voltage supply having an external voltage level different from said supply voltage level; wherein:
   said first transistor and said second transistor are configured, when switching said supply voltage level from said first voltage level to said second voltage level, to compete with said first transistor pulling said signal node voltage level towards said supply voltage level and said second transistor pulling said signal node voltage level towards said external voltage level, said first transistor being configured to overcome said second transistor when said supply voltage level reaches said predetermined voltage level; and
   said signal output is configured to output said ready signal in dependence on when said first transistor overcomes said second transistor.

2. The power supply detection circuitry according to claim 1, wherein said first transistor has a higher saturation current than said second transistor.

3. The power supply detection circuitry according to claim 1, wherein said first transistor overcomes said second transistor after said second transistor reaches saturation.

4. The power supply detection circuitry according to claim 1, wherein said ready signal has a ready state indicating that said supply voltage level has reached said predetermined voltage level and an unready state indicating that said supply voltage level has not reached said predetermined voltage level.

5. The power supply detection circuitry according to claim 4, comprising logic coupled between said signal node and said signal output, said logic being configured to switch said ready signal from said unready state to said ready state when said first transistor overcomes said second transistor to pull said signal node voltage level beyond a threshold voltage level.

6. The power supply detection circuitry according to claim 5, wherein said logic comprises an inverter.

7. The power supply detection circuitry according to claim 5, wherein a gate terminal of said second transistor is coupled to said logic such that said second transistor is switched off when said signal node voltage level is pulled beyond said threshold voltage level by said first transistor.

8. The power supply detection circuitry according to claim 1, wherein said first transistor is turned on in response to initiation of said switching of said supply voltage level from said first voltage level to said second voltage level.

9. The power supply detection circuitry according to claim 1, comprising a third transistor coupled between said external power supply and said signal node, said third transistor being turned on prior to switching said supply voltage level from said first voltage level to said second voltage level and being turned off in response to initiation of said switching of said supply voltage level from said first voltage level to said second voltage level.

10. The power supply detection circuitry according to claim 1, comprising a plurality of said power supply detecting units.

11. The power supply detection circuitry according to claim 10, wherein said plurality of power supply detecting units comprise a chain of N power supply detecting units;
   said first transistor of a first power supply detecting unit in said chain is turned on in response to initiation of said switching of said supply voltage level from said first voltage level to said second voltage level;
   said first transistor of an $i^{th}$ power supply detecting unit in said chain is turned on in response to said ready signal of an $(i-1)^{th}$ power supply detecting unit indicating that said supply voltage level has reached said predetermined voltage level, where $2 \leq i \leq N$; and
   said ready signal of an $N^{th}$ power supply detecting unit in said chain indicates to said processing circuit whether said supply voltage level has reached said predetermined voltage level.

12. The power supply detection circuitry according to claim 1, wherein said power supply rail is a ground supply rail for said processing circuit, and said first voltage level and said external voltage level are higher than said second voltage level.

13. The power supply detection circuitry according to claim 1, wherein said power supply rail is a main supply rail for said processing circuit, and said first voltage level and said external voltage level are lower than said second voltage level.

14. A processing apparatus comprising:
   a processing circuit;
   a power supply rail for supplying a supply voltage level to said processing circuit;
   power control circuitry for switching said supply voltage level from a first voltage level to a second voltage level; and
   power supply detection circuitry according to claim 1.

15. The processing apparatus according to claim 14, wherein said processing circuit is responsive to said ready signal indicating that said supply voltage level has reached said predetermined voltage level to trigger a data processing operation.

16. The processing apparatus according to claim 14, comprising a first processing circuit and a second processing circuit, said first processing circuit and said second processing circuit each having a corresponding power supply rail and power control circuit, at least said first processing circuit having a corresponding power supply detection circuitry;
   wherein switching of said supply voltage level for said second processing circuit from said first voltage level to said second voltage level is initiated in response to said power supply detection circuitry for said first processing circuit outputting said ready signal indicating that said supply voltage level for said first processing circuit has reached said predetermined voltage level.

17. Power supply detection circuitry, coupled to power supply means for supplying power to a processing circuit, comprising at least one power supply detecting means for detecting whether, when switching a supply voltage level of said power supply means from a first voltage level to a second voltage level, said supply voltage level has reached a predetermined voltage level, said power supply detecting means comprising:
   signal output means for outputting a ready signal indicating whether said supply voltage level has reached said predetermined voltage level;

signal node means for carrying a signal node voltage level, said signal node being coupled to said signal output means, said signal output means outputting said ready signal in dependence on a signal node voltage level at said signal node means;

first transistor means for coupling said power supply means and said signal node means; and second transistor means for coupling said signal node means and an external voltage supply means for supplying an external voltage level different from said supply voltage level; wherein:

said first transistor means and said second transistor means are configured, when switching said supply voltage level from said first voltage level to said second voltage level, to compete with said first transistor means pulling said signal node voltage level towards said supply voltage level and said second transistor means pulling said signal node voltage level towards said external voltage level, said first transistor means being configured to overcome said second transistor means when said supply voltage level reaches said predetermined voltage level; and said signal output means is configured to output said ready signal in dependence on when said first transistor means overcomes said second transistor means.

18. A method for detecting whether, when switching a supply voltage level of a power supply rail for a processing circuit from a first voltage level to a second voltage level, said supply voltage level has reached a predetermined voltage level, said method comprising:

switching said supply voltage level from said first voltage level to said second voltage level;

configuring a first transistor, coupled between said power supply rail and a signal node having a signal node voltage level, and a second transistor, coupled between said signal node and an external voltage supply having an external voltage level different from said supply voltage level, to compete with said first transistor pulling said signal node voltage level towards said supply voltage level and said second transistor pulling said signal node voltage level towards said external voltage level, said first transistor being configured to overcome said second transistor when said supply voltage level reaches said predetermined voltage level;

outputting a ready signal in dependence on said signal node voltage level and in dependence on when said first transistor overcomes said second transistor.

19. Power supply detection circuitry, coupled to a power supply rail for a processing circuit, comprising at least one power supply detecting unit for detecting whether, when switching a supply voltage level of said power supply rail from a first voltage level to a second voltage level, said supply voltage level has reached a predetermined voltage level, said power supply detecting unit comprising:

a signal output for outputting a ready signal indicating whether said supply voltage level has reached said predetermined voltage level;

a signal node coupled to said signal output, said signal output outputting said ready signal in dependence on a signal node voltage level at said signal node;

a first transistor coupled to said power supply rail and said signal node; and a second transistor coupled to said signal node and an external voltage supply having an external voltage level; wherein:

said first transistor and said second transistor are configured, when switching said supply voltage level from said first voltage level to said second voltage level, to compete with said first transistor pulling said signal node voltage level towards said supply voltage level and said second transistor pulling said signal node voltage level towards said external voltage level, said first transistor being configured to overcome said second transistor when said supply voltage level reaches said predetermined voltage level;

said signal output is configured to output said ready signal in dependence on when said first transistor overcomes said second transistor, wherein said ready signal has a ready state indicating that said supply voltage level has reached said predetermined voltage level and an unready state indicating that said supply voltage level has not reached said predetermined voltage level; and logic coupled between said signal node and said signal output, said logic being configured to switch said ready signal from said unready state to said ready state when said first transistor overcomes said second transistor to pull said signal node voltage level beyond a threshold voltage level, wherein a gate terminal of said second transistor is coupled to said logic such that said second transistor is switched off when said signal node voltage level is pulled beyond said threshold voltage level by said first transistor.

20. Power supply detection circuitry, coupled to a power supply rail for a processing circuit, comprising at least one power supply detecting unit for detecting whether, when switching a supply voltage level of said power supply rail from a first voltage level to a second voltage level, said supply voltage level has reached a predetermined voltage level, said power supply detecting unit comprising:

a signal output for outputting a ready signal indicating whether said supply voltage level has reached said predetermined voltage level;

a signal node coupled to said signal output, said signal output outputting said ready signal in dependence on a signal node voltage level at said signal node;

a first transistor coupled to said power supply rail and said signal node; and a second transistor coupled to said signal node and an external voltage supply having an external voltage level; wherein:

said first transistor and said second transistor are configured, when switching said supply voltage level from said first voltage level to said second voltage level, to compete with said first transistor pulling said signal node voltage level towards said supply voltage level and said second transistor pulling said signal node voltage level towards said external voltage level, said first transistor being configured to overcome said second transistor when said supply voltage level reaches said predetermined voltage level; and said signal output is configured to output said ready signal in dependence on when said first transistor overcomes said second transistor, comprising a plurality of said power supply detecting units, wherein said plurality of power supply detecting units comprise a chain of N power supply detecting units;

said first transistor of a first power supply detecting unit in said chain is turned on in response to initiation of said switching of said supply voltage level from said first voltage level to said second voltage level;

said first transistor of an $i^{th}$ power supply detecting unit in said chain is turned on in response to said ready signal of an $(i-1)^{th}$ power supply detecting unit indicating that said supply voltage level has reached said predetermined voltage level, where $2 \leq i \leq N$; and said ready signal of an $N^{th}$ power supply detecting unit in said chain indicates to said processing circuit whether said supply voltage level has reached said predetermined voltage level.

21. A processing apparatus comprising:

a processing circuit;

a power supply rail for supplying a supply voltage level to said processing circuit;

power control circuitry for switching said supply voltage level from a first voltage level to a second voltage level; and power supply detection circuitry, coupled to a power supply rail for a processing circuit, comprising at least one power supply detecting unit for detecting whether, when switching a supply voltage level of said power supply rail from a first voltage level to a second voltage level, said supply voltage level has reached a predetermined voltage level, said power supply detecting unit comprising:

a signal output for outputting a ready signal indicating whether said supply voltage level has reached said predetermined voltage level;

a signal node coupled to said signal output, said signal output outputting said ready signal in dependence on a signal node voltage level at said signal node;

a first transistor coupled to said power supply rail and said signal node; and a second transistor coupled to said signal node and an external voltage supply having an external voltage level; wherein:

said first transistor and said second transistor are configured, when switching said supply voltage level from said first voltage level to said second voltage level, to compete with said first transistor pulling said signal node voltage level towards said supply voltage level and said second transistor pulling said signal node voltage level towards said external voltage level, said first transistor being configured to overcome said second transistor when said supply voltage level reaches said predetermined voltage level; and said signal output is configured to output said ready signal in dependence on when said first transistor overcomes said second transistor; and a first processing circuit and a second processing circuit, said first processing circuit and said second processing circuit each having a corresponding power supply rail and power control circuit, at least said first processing circuit having a corresponding power supply detection circuitry; wherein switching of said supply voltage level for said second processing circuit from said first voltage level to said second voltage level is initiated in response to said power supply detection circuitry for said first processing circuit outputting said ready signal indicating that said supply voltage level for said first processing circuit has reached said predetermined voltage level.

* * * * *